US010930687B2

(12) United States Patent
Byun

(10) Patent No.: US 10,930,687 B2
(45) Date of Patent: Feb. 23, 2021

(54) IMAGE SENSOR HAVING PHASE DIFFERENCE DETECTION PIXEL

(71) Applicant: SK hynix Inc., Icheon-si (KR)

(72) Inventor: Kyung-Su Byun, Gwangju-si (KR)

(73) Assignee: SK hynix Inc., Icheon-si (KR)

( * ) Notice: Subject to any disclaimer, the term of this patent is extended or adjusted under 35 U.S.C. 154(b) by 207 days.

(21) Appl. No.: 15/914,959

(22) Filed: Mar. 7, 2018

(65) Prior Publication Data

US 2019/0035838 A1  Jan. 31, 2019

(30) Foreign Application Priority Data

Jul. 28, 2017  (KR) .................. 10-2017-0096347

(51) Int. Cl.
  *H01L 27/146*  (2006.01)
  *H01L 23/50*  (2006.01)

(52) U.S. Cl.
  CPC ........ *H01L 27/14621* (2013.01); *H01L 23/50* (2013.01); *H01L 27/14605* (2013.01); *H01L 27/14623* (2013.01); *H01L 27/14625* (2013.01); *H01L 27/14627* (2013.01); *H01L 27/14645* (2013.01)

(58) Field of Classification Search
  CPC ............... H01L 27/14621; H01L 23/50; H01L 27/14605; H01L 27/14623; H01L 27/14625; H01L 27/14627; H01L 27/14645

See application file for complete search history.

(56) References Cited

U.S. PATENT DOCUMENTS

| 2015/0319412 | A1* | 11/2015 | Koshiba ............. H01L 27/1464 348/246 |
| 2015/0357364 | A1 | 12/2015 | Kim |
| 2016/0276396 | A1 | 9/2016 | Tayanaka |
| 2016/0366355 | A1 | 12/2016 | Kato |

FOREIGN PATENT DOCUMENTS

| CN | 101630110 A | 1/2010 |
| CN | 103797579 A | 5/2014 |
| CN | 104425532 A | 3/2015 |
| JP | H0818990 A | 1/1996 |
| KR | 10-2015-0060024 | 6/2015 |

* cited by examiner

*Primary Examiner* — Georgia Y Epps
*Assistant Examiner* — Don J Williams
(74) *Attorney, Agent, or Firm* — Perkins Coie LLP

(57) ABSTRACT

An image sensor is provided to include: imaging pixels located at different locations to receive incident light and to produce pixel signals, each imaging pixel including a light-receiving area that receives a portion of the incident light and a photoelectric conversion element to convert received portion of incident into a pixel signal associated with part of the image; and a phase difference detection pixel located amongst the imaging pixels and structured to include an open part which receives a portion of the incident light and a photoelectric conversion element to convert the received light into a phase difference detection pixel signal, wherein the open part is eccentrically located in the phase difference detection pixel in a first direction, wherein the imaging pixels include a first imaging pixel that is adjacent to the phase difference detection pixel in the first direction and senses a first color.

34 Claims, 9 Drawing Sheets

IMAGE SENSOR HAVING PHASE DIFFERENCE DETECTION PIXEL

CROSS-REFERENCE TO RELATED APPLICATION

This patent document claims the priority and benefits of Korean Patent Application No. 10-2017-0096347 filed on Jul. 28, 2017 in the Korean Intellectual Property Office, the disclosure of which is incorporated herein by reference in its entirety.

TECHNICAL FIELD

The technology and implementations disclosed in this patent document relate to semiconductor image sensors.

BACKGROUND

An image sensor is a device which receives light from an optical image or one or more objects and converts the received light into electrical signals forming an image. Recently, with the development of the computer industry and communication industry, the demand for an image sensor having improved performance is increasing in various fields or applications, including, e.g., a digital camera, a camcorder, a portable device such as a personal communication system, a game machine, a security camera, a medical micro-camera and a robot.

SUMMARY

Various embodiments are directed to provide an image sensor having improved performance.

In one aspect, an image sensor is provided to comprise: a phase difference detection pixel having an open part which is eccentric in a first direction; and a plurality of imaging pixels surrounding the phase difference detection pixel, wherein, among the plurality of imaging pixels, a first pixel that is adjacent to the phase difference detection pixel in the first direction, and imaging pixels suitable for sensing a same color as a color sensed by the first pixel have a light-receiving area smaller than a light-receiving area of imaging pixels suitable for sensing a color that differs from the color sensed by the first pixel. In some implementations, a light blocking layer formed between the photoelectric conversion element of the phase difference detection pixel and a photoelectric conversion element of the first imaging pixel to reduce optical crosstalk. In some implementations, the light blocking layer is formed on at least one of sidewalls of a photoelectric conversion element of the first imaging pixel. In some implementations, the light blocking layer is formed on at least one of sidewalls of the photoelectric conversion element of the phase difference detection pixel. In some implementations, among the plurality of imaging pixels, the first imaging pixel group include a second imaging pixel that is adjacent to the phase difference detection pixel in a second direction, which is opposite to the first direction. In some implementations, the light-receiving area of the first imaging pixel is substantially equal to a light-receiving area of the second imaging pixel. In some implementations, the light-receiving area of the first imaging pixel is smaller than a light-receiving area of the second imaging pixel. In some implementations, the first imaging pixel group include a second imaging pixel that is adjacent to the phase difference detection pixel in a second direction, which is opposite to the first direction, a third imaging pixel that is adjacent to the phase difference detection pixel in a third direction, which is crossing the first direction, and a fourth imaging pixel that is adjacent to the phase difference detection pixel in a fourth direction, which is opposite to the third direction, and the light-receiving areas of the first to fourth imaging pixels are substantially equal to each other. In some implementations, the first imaging pixel group include a second imaging pixel that is adjacent to the phase difference detection pixel in a second direction, which is opposite to the first direction, a third imaging pixel that is adjacent to the phase difference detection pixel in a third direction, which is crossing the first direction, and a fourth imaging pixel that is adjacent to the phase difference detection pixel in a fourth direction, which is opposite to the third direction, and the light-receiving area of the first imaging pixel is the smallest, and light-receiving areas of the second to fourth imaging pixels are substantially equal to each other. In some implementations, the first imaging pixel group include a second imaging pixel that is adjacent to the phase difference detection pixel in a second direction, which is opposite to the first direction, a third imaging pixel that is adjacent to the phase difference detection pixel in a third direction, which is crossing the first direction, and a fourth imaging pixel that is adjacent to the phase difference detection pixel in a fourth direction, which is opposite to the third direction, and wherein the light-receiving area of the first imaging pixel is the smallest, a light-receiving area of the second imaging pixel is the largest, and light-receiving areas of the third imaging pixel and the fourth imaging pixel are substantially equal to each other.

In another aspect, an image sensor is provided to comprise: a substrate; and a plurality of pixels formed on the substrate with each pixel having one photoelectric conversion element that converts light into an electrical signal, wherein the pixels are structured to include imaging pixels that convert incident light into imaging pixel signals for forming an image and phase difference detection pixels each of which includes an open part which allows reception of light to convert the received light into a phase difference detection pixel signal for optical sensing of a phase of the image, is eccentric in position within each phase difference detection pixel in a first direction, and is arranged to be adjacent to different imaging pixels, and wherein at least one imaging pixel adjacent to a phase difference detection pixel includes a light-shield pattern formed over the substrate so as to overlap a photoelectric conversion element of the imaging pixel to form an open part for receiving light in a light-receiving area smaller than a light-receiving area of another imaging pixel among the imaging pixels. In some implementations, the imaging pixel adjacent to a corresponding phase difference detection pixel having a light-receiving area smaller than a light-receiving area of another imaging pixel among the imaging pixels is an imaging pixel that is shifted from the corresponding phase difference detection pixel along the first direction. In some implementations, there are multiple imaging pixels that are adjacent to a corresponding phase difference detection pixel and that each have a light-receiving area smaller than a light-receiving area of some other imaging pixels among the imaging pixels. In some implementations, the multiple imaging pixels that are adjacent to a corresponding phase difference detection pixel and that each have a light-receiving area smaller than a light-receiving area of some other imaging pixels among the imaging pixel are structured to sense light of a designated color. In some implementations, the designated color is a blue color. In some implementations, each of the other imaging pixels among the imaging pixels, which have a light-receiving area larger than a light-receiving area of the multiple imaging pixels that are adjacent to a corresponding phase difference detection pixel and are structured to sense light of the designated color, is structured to sense light of a color different from the designated color. In some implementations, the image sensor further comprises: a light blocking layer formed between a photoelectric conversion element of each phase difference detection pixel and a photoelectric conversion element of an imaging pixel adjacent to each phase difference detection pixel to reduce optical crosstalk. In some implementations, the light blocking layer fills a trench formed in the substrate. In some implementations, the light blocking layer at least partially covers the photoelectric conversion element of the adjacent imaging pixel. In some implementations, the light blocking layer at partially covers the photoelectric conversion element of the phase difference detection pixel. In some implementations, the image sensor further comprises: a grid pattern formed over the substrate along boundaries of the phase difference detection pixel and the imaging pixels, wherein the light-shield pattern is structured to abut on the grid pattern.

In another aspect, an image sensor is provided to comprise: a substrate including a plurality of photoelectric conversion elements respectively corresponding to a plurality of pixels, wherein the pixels include a phase difference detection pixel having an open part which is eccentrically located in the phase difference detection pixel in a first direction, and a plurality of imaging pixels surrounding the phase difference detection pixel, and wherein the plurality of imaging pixels include a first imaging pixel that is adjacent to the phase difference detection pixel in the first direction; a grid pattern formed over the substrate along boundaries of the pixels; a first light-shield pattern that formed over a photoelectric conversion element of the first imaging pixel, the first light-shield pattern abutting on the grid pattern and has a first open part and having a first open part, wherein an area of the first open part is smaller than a light-receiving area of remaining imaging pixels; a light blocking layer formed between a photoelectric conversion element of the phase difference detection pixel and the photoelectric conversion element of the first imaging pixel.

In some implementations, the first light-shield pattern has a ring shape to include a peripheral area that blocks light and a central open part that allows transmission of light. In some implementations, the peripheral area includes a first region that is close to the phase difference detection pixel and a second region different from the first region, the first region having a line width wider than the second region. In some implementations, the image sensor further comprises: a second light-shield pattern formed over a photoelectric conversion element of a second imaging pixel that is adjacent to the phase difference detection pixel in a second direction, which is opposite to the first direction, among the imaging pixels, the second light-shield pattern abutting on the grid pattern and having a second open part; a third light-shield pattern formed over a photoelectric conversion element of a third imaging pixel that is adjacent to the phase difference detection pixel in a third direction, which is perpendicular to the first direction, among the imaging pixels, the third light-shield pattern abutting on the grid pattern and having a third open part; and a fourth light-shield pattern formed over a photoelectric conversion element of a fourth imaging pixel that is adjacent to the phase difference detection pixel in a fourth direction, which is opposite to the third direction, among the imaging pixels, the fourth light-shield pattern abutting on the grid pattern and having a fourth open part, wherein each of the second to fourth open parts has an area that is smaller than a light-receiving area of remaining imaging pixels.

In some implementations, each of the second to fourth light-shield pattern has a ring shape to include a peripheral area that blocks light and a central open part that allows transmission of light. In some implementations, the peripheral area includes a first region that is close to the phase difference detection pixel and a second region different from the first region, the first region having a line width wider than the second region. In some implementations, the areas of the first to fourth open parts are substantially equal to each other. In some implementations, the area of the first open part is smallest, and the areas of the second to fourth open parts are substantially equal to each other. In some implementations, the area of the first open part is smallest, the area of the second open part is largest, and the areas of the third open part and the fourth open part are substantially equal to each other. In some implementations, the first to fourth imaging pixels sense a same color. In some implementations, the light blocking layer is formed in a trench formed in the substrate. In some implementations, the light blocking layer is formed on at least one of sidewalls of the photoelectric conversion element of the first imaging pixel. In some implementations, the light blocking layer is formed on at least one of sidewalls of the photoelectric conversion element of the phase difference detection pixel.

In an embodiment, an image sensor may include: a plurality of imaging pixels located at different locations to receive incident light and to produce pixel signals representing respectively received portions of the incident light for forming an image, each imaging pixel including a light-receiving area that receives a portion of the incident light and a photoelectric conversion element to convert received portion of incident into a pixel signal associated with part of the image; and a phase difference detection pixel located amongst the plurality of imaging pixels and structured to include an open part which receives a portion of the incident light and a photoelectric conversion element to convert the received light into a phase difference detection pixel signal for optical sensing of a phase of the image formed by the pixel signals from the plurality of the imaging pixels, wherein the open part is eccentrically located in the phase difference detection pixel in a first direction, wherein the plurality of imaging pixels include a first imaging pixel that is adjacent to the phase difference detection pixel in the first direction and senses a first color, first imaging pixel group for sensing the first color, and second imaging pixel group for sensing different colors from the first color, wherein each of the first imaging pixel and first imaging pixel group has a light-receiving area smaller than a light-receiving area of each of the second imaging pixel group.

In some implementations, the image sensor may further include: a light blocking layer formed between the photoelectric conversion element of the phase difference detection pixel and a photoelectric conversion element of the first imaging pixel to reduce optical crosstalk. In some implementations, the light blocking layer is formed on at least one of sidewalls of a photoelectric conversion element of the first imaging pixel. In some implementations, the light blocking layer is formed on at least one of sidewalls of the photoelectric conversion element of the phase difference detection pixel.

In some implementations, among the plurality of imaging pixels, the first imaging pixel group include a second imaging pixel that is adjacent to the phase difference detection pixel in a second direction, which is opposite to the first direction. In some implementations, the light-receiving area of the first imaging pixel is substantially equal to a light-receiving area of the second imaging pixel. In some implementations, the light-receiving area of the first imaging pixel is smaller than a light-receiving area of the second imaging pixel.

In some implementations, the first imaging pixel group includes a second imaging pixel that is adjacent to the phase difference detection pixel in a second direction, which is opposite to the first direction, a third imaging pixel that is adjacent to the phase difference detection pixel in a third direction, which is crossing the first direction, and a fourth imaging pixel that is adjacent to the phase difference detection pixel in a fourth direction, which is opposite to the third direction, and the light-receiving areas of the first to fourth imaging pixels are substantially equal to each other.

In some implementations, the first imaging pixel group includes a second imaging pixel that is adjacent to the phase difference detection pixel in a second direction, which is opposite to the first direction, a third imaging pixel that is adjacent to the phase difference detection pixel in a third direction, which is crossing the first direction, and a fourth imaging pixel that is adjacent to the phase difference detection pixel in a fourth direction, which is opposite to the third direction, and the light-receiving area of the first imaging pixel is the smallest, and light-receiving areas of the second to fourth imaging pixels are substantially equal to each other.

In some implementations, the first imaging pixel group includes a second imaging pixel that is adjacent to the phase difference detection pixel in a second direction, which is opposite to the first direction, a third imaging pixel that is adjacent to the phase difference detection pixel in a third direction, which is crossing the first direction, and a fourth imaging pixel that is adjacent to the phase difference detection pixel in a fourth direction, which is opposite to the third direction, and wherein the light-receiving area of the first imaging pixel is the smallest, a light-receiving area of the second imaging pixel is the largest, and light-receiving areas of the third imaging pixel and the fourth imaging pixel are substantially equal to each other.

In an embodiment, an image sensor may include: a substrate; and a plurality of pixels formed on the substrate with each pixel having one photoelectric conversion element that converts light into an electrical signal, wherein the pixels are structured to include imaging pixels that convert incident light into imaging pixel signals for forming an image and phase difference detection pixels each of which includes an open part which allows reception of light to convert the received light into a phase difference detection pixel signal for optical sensing of a phase of the image, is eccentric in position within each phase difference detection pixel in a first direction, and is arranged to be adjacent to different imaging pixels, and wherein at least one imaging pixel adjacent to a phase difference detection pixel includes a light-shield pattern formed over the substrate so as to overlap a photoelectric conversion element of the imaging pixel to form an open part for receiving light in a light-receiving area smaller than a light-receiving area of another imaging pixel among the imaging pixels.

In some implementations, the imaging pixel adjacent to a corresponding phase difference detection pixel having a light-receiving area smaller than a light-receiving area of another imaging pixel among the imaging pixels is an imaging pixel that is shifted from the corresponding phase difference detection pixel along the first direction. In some implementations, there are multiple imaging pixels that are adjacent to a corresponding phase difference detection pixel and that each have a light-receiving area smaller than a light-receiving area of some other imaging pixels among the imaging pixels. In some implementations, the multiple imaging pixels that are adjacent to a corresponding phase difference detection pixel and that each have a light-receiving area smaller than a light-receiving area of some other imaging pixels among the imaging pixel are structured to sense light of a designated color. In some implementations, the designated color is a blue color. In some implementations, each of the other imaging pixels among the imaging pixels, which have a light-receiving area larger than a light-receiving area of the multiple imaging pixels that are adjacent to a corresponding phase difference detection pixel and are structured to sense light of the designated color, is structured to sense light of a color different from the designated color.

In some implementations, the image sensor may further include: a light blocking layer formed between a photoelectric conversion element of each phase difference detection pixel and a photoelectric conversion element of an imaging pixel adjacent to each phase difference detection pixel to reduce optical crosstalk. In some implementations, the light blocking layer fills a trench formed in the substrate. In some implementations, the light blocking layer at least partially covers the photoelectric conversion element of the adjacent imaging pixel. In some implementations, the light blocking layer at partially covers the photoelectric conversion element of the phase difference detection pixel.

In some implementations, the image sensor may further include: a grid pattern formed over the substrate along boundaries of the phase difference detection pixel and the imaging pixels, wherein the light-shield pattern is structured to abut on the grid pattern.

In an embodiment, an image sensor may include: a substrate including a plurality of photoelectric conversion elements respectively corresponding to a plurality of pixels, wherein the pixels include a phase difference detection pixel having an open part which is eccentrically located in the phase difference detection pixel in a first direction, and a plurality of imaging pixels surrounding the phase difference detection pixel, and wherein the plurality of imaging pixels include a first imaging pixel that is adjacent to the phase difference detection pixel in the first direction; a grid pattern formed over the substrate along boundaries of the pixels; a first light-shield pattern that formed over a photoelectric conversion element of the first imaging pixel, the first light-shield pattern abutting on the grid pattern and has a first open part and having a first open part, wherein an area of the first open part is smaller than a light-receiving area of remaining imaging pixels; a light blocking layer formed between a photoelectric conversion element of the phase difference detection pixel and the photoelectric conversion element of the first imaging pixel.

In some implementations, the first light-shield pattern has a ring shape to include a peripheral area that blocks light and a central open part that allows transmission of light. In some implementations, the peripheral area includes a first region that is close to the phase difference detection pixel and a second region different from the first region, the first region having a line width wider than the second region.

In some implementations, the image sensor may further include: a second light-shield pattern formed over a photoelectric conversion element of a second imaging pixel that is adjacent to the phase difference detection pixel in a second direction, which is opposite to the first direction, among the imaging pixels, the second light-shield pattern abutting on the grid pattern and having a second open part; a third light-shield pattern formed over a photoelectric conversion element of a third imaging pixel that is adjacent to the phase difference detection pixel in a third direction, which is perpendicular to the first direction, among the imaging pixels, the third light-shield pattern abutting on the grid pattern and having a third open part; and a fourth light-shield pattern formed over a photoelectric conversion element of a fourth imaging pixel that is adjacent to the phase difference detection pixel in a fourth direction, which is opposite to the third direction, among the imaging pixels, the fourth light-shield pattern abutting on the grid pattern and having a fourth open part, wherein each of the second to fourth open parts has an area that is smaller than a light-receiving area of remaining imaging pixels. In some implementations, each of the second to fourth light-shield pattern has a ring shape to include a peripheral area that blocks light and a central open part that allows transmission of light. In some implementations, the peripheral area includes a first region that is close to the phase difference detection pixel and a second region different from the first region, the first region having a line width wider than the second region. The areas of the first to fourth open parts are substantially equal to each other. In some implementations, the area of the first open part is smallest, and the areas of the second to fourth open parts are substantially equal to each other. In some implementations, the area of the first open part is smallest, the area of the second open part is largest, and the areas of the third open part and the fourth open part are substantially equal to each other. In some implementations, the first to fourth imaging pixels sense a same color.

In some implementations, the light blocking layer is formed in a trench formed in the substrate. In some implementations, the light blocking layer is formed on at least one of sidewalls of the photoelectric conversion element of the first imaging pixel. In some implementations, the light blocking layer is formed on at least one of sidewalls of the photoelectric conversion element of the phase difference detection pixel.

DETAILED DESCRIPTION

Figure 1:
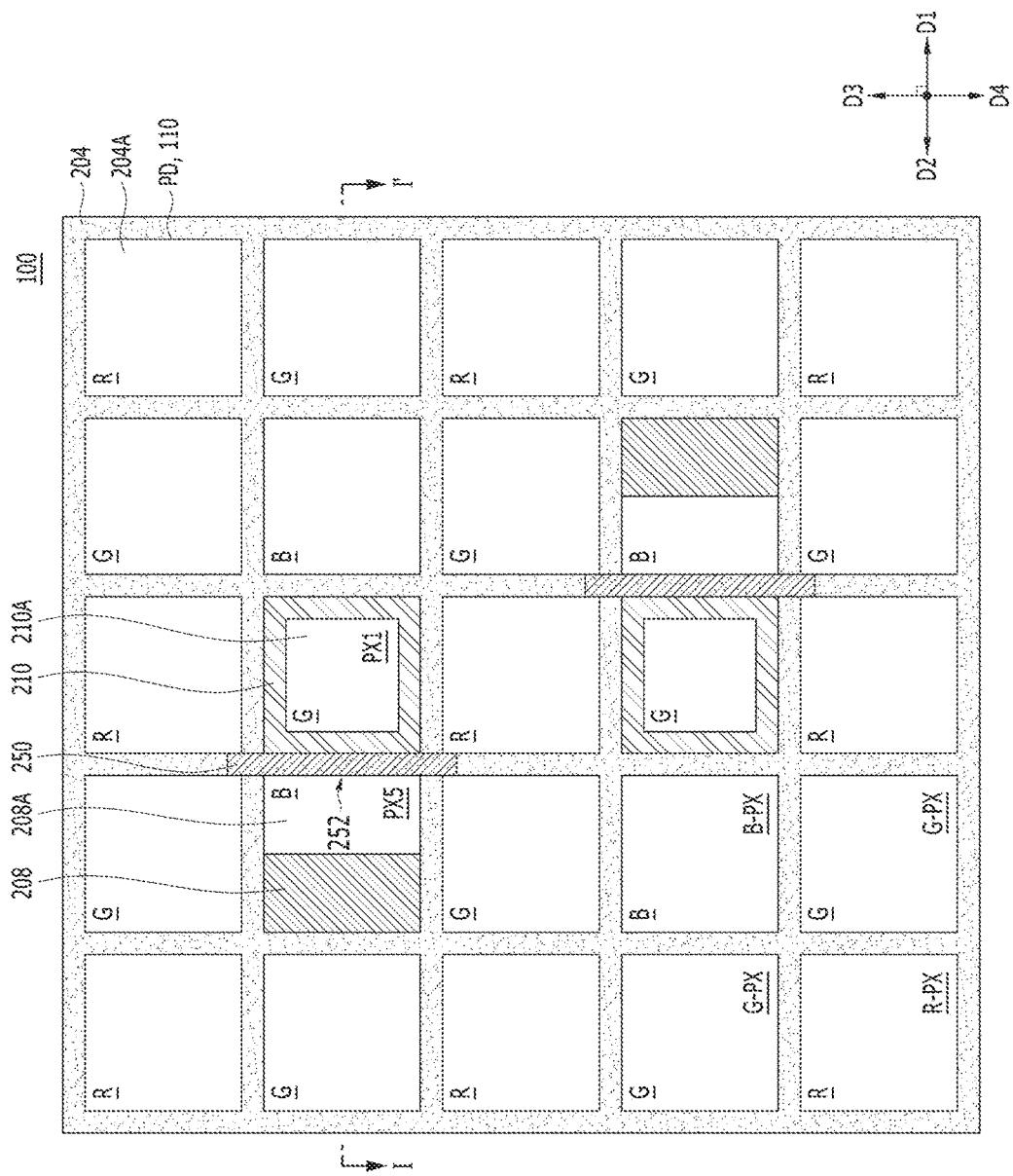
FIG. 1 and FIG. 2 are views illustrating an exemplary image sensor in accordance with a first embodiment of the present disclosure.

The disclosed image sensing technology can be implemented to provide an image sensor device to improve the imaging operation performance. In some implementations, an image sensor array is provided to include imaging pixels and phase difference detection pixels where the imaging pixels are designed and operated for capturing incident light to capture or represent a subject or a scene as a color image, and the phase difference detection pixels are designed and operated for capturing incident light at different phase difference detection pixels to detect a phase of a captured image or scene for implementing auto-focusing and representing a three-dimensional representation of the captured image or scene. In some implementations of phase difference detection pixels, two different phase detection pixels can be paired to obtain signals that can be processed to measure the distance difference or the phase of a detected image for automatic focusing or 3D image rendition in optical imaging. Under this design, the imaging pixels and the phase difference detection pixels are spatially distributed in the same pixel array and, accordingly, due to the placement of the phase difference detection pixels amidst imaging pixels, in imaging construction of the entire pixel array, an interpolation process is performed to process or interpolate pixel signals from imaging pixels adjacent to a phase difference detection pixel to produce an interpolated imaging pixel signal value for the phase detection pixel. As a result, the pixel signals from imaging pixels and the interpolated imaging pixel signal values for phase difference detection pixels are combined to construct a captured image by the image sensor array.

The disclosed image sensor arrays can be based on various semiconductor sensor structures including, for example, a complementary metal oxide semiconductor (CMOS) image sensor or CIS. A CIS sensor can include an array of imaging pixels each including a photosensor that converts received light into electric charges, which may be a photogate, a photodiode, a phototransistor, a photoconductor, or a photosensitive structure capable of generating photo-generated charges. Each imaging pixel can also include a charge storage region for storing the photo-generated charges, which may be constructed as a floating diffusion region in some implementations. Additional circuitry may be included in each imaging pixel, e.g., a transfer transistor for transferring the photo-generated charges from the photosensor to the storage region and a reset circuitry for resetting the charges in the charge storage region after a readout.

In specific implementations, the disclosed technology based on having both imaging pixels and phase difference detection pixels in the same sensor array can be used to reduce or prevent undesired leakage of some of the light received at one of the phase difference detection pixels to one of the imaging pixels and that is adjacent to the phase difference detection pixel. This undesired leakage of light between adjacent imaging and phase difference detection pixels is one form of optical crosstalk. The disclosed technology can be implemented to provide image sensors having both imaging pixels and phase difference detection pixels in a sensor array with pixel configurations and techniques for mitigating or preventing undesired optical crosstalk that occurs between an imaging pixel and a phase difference detection pixel in the disclosed image sensors.

Optical crosstalk that occurs between an imaging pixel and a phase difference detection pixel may cause a problem or an undesired effect such as degrading the characteristics of the image sensor. For example, optical crosstalk may cause the brightness of the imaging pixels in the image sensor to be non-uniform over the sensor array. For example, when optical cross talk occurs, imaging pixels adjacent to a phase difference detection pixel may appear brighter than other imaging pixels because incident light to the phase difference detection pixel may enter into the adjacent imaging pixels. In order to solve this problem and prevent the degradation of the characteristics of the image sensor, a light isolation feature may be provided to reduce this extra light received at certain imaging pixels located adjacent to a phase difference detection pixel based on, e.g., forming a trench isolation structure, for example, Shallow Trench Isolation (STI) or Deep Trench Isolation (DTI), across the whole area of a pixel array. However, using a trench isolation structure may be disadvantageous in that the process of forming a trench inevitably induces defects on the surface of the trench and the defects on the surface of the trench can act as the source of leakage current such as a dark current, which degrades the characteristics of the image sensor.

The disclosed technology provides a new approach to arranging and configuring an image sensor including a plurality of imaging pixels and a plurality of phase difference detection pixels to reduce or prevent optical crosstalk between adjacent imaging and phase difference detection pixels and thus the degradation of the characteristics of the image sensor. One embodiment of the present disclosure provides a method through which optical crosstalk occurring between an imaging pixel and a phase difference detection pixel can be mitigated or prevented. To this end, an image sensor in accordance with an embodiment of the disclosed technology may include phase difference detection pixels, each which includes a phase difference pattern having an eccentrically located open part that is off the geometric center of each phase difference detection pixel. The exemplary image sensor further includes imaging pixels surrounding a phase difference detection pixel and a surrounding imaging pixel that is adjacent to the open part of the phase difference detection pixel in a direction in which the open part is eccentrically located from the geometric center of the phase difference detection pixel may have a light-receiving area that is smaller or not greater than the light-receiving area of the remaining imaging pixels surrounding the phase difference detection pixel. Specifically, the imaging pixel that is adjacent to the phase difference detection pixel in the direction in which the open part is eccentrically located includes a light-shield pattern that overlaps the photoelectric conversion element thereof to reduce its light receiving area, and the light-shield pattern may function to control the amount of incident light. The light-shield pattern to provide different light receiving areas for certain imaging pixels adjacent to phase difference detection pixels.

Figure 2:
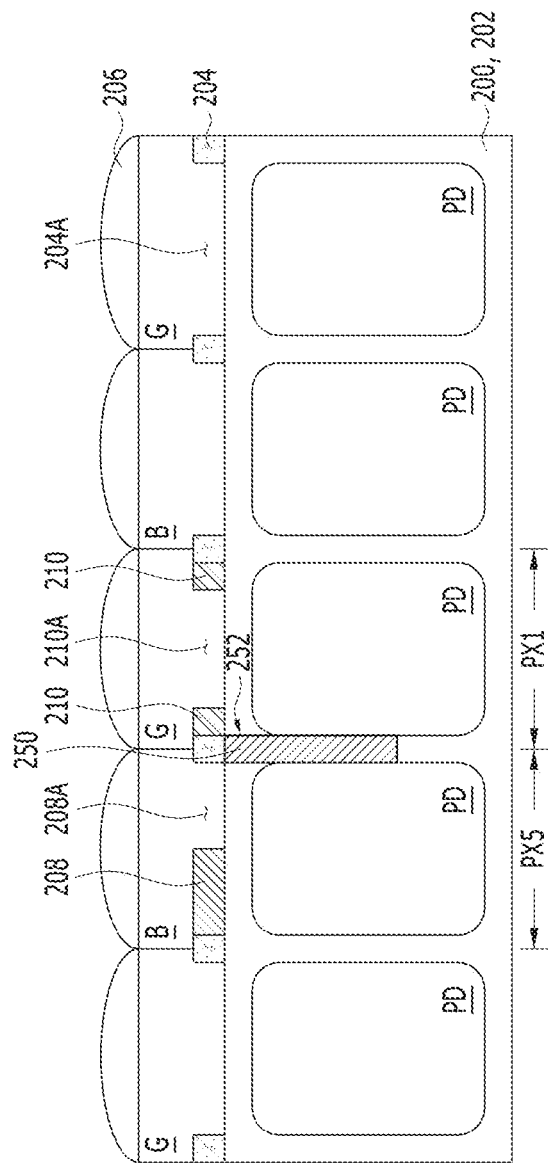

FIG. 1 and FIG. 2 are views illustrating an example of an image sensor in accordance with a first embodiment of the present disclosure. Specifically, FIG. 1 is a plan view illustrating a part of a pixel array of the illustrated image sensor example, and FIG. 2 is a cross-sectional view of the pixel array illustrating a cross section cut along the dotted line I-I' shown in FIG. 1.

As illustrated in FIG. 1 and FIG. 2, the image sensor in accordance with the first embodiment may include a pixel array 100 in which a plurality of pixels 110 are arranged in a matrix form, e.g., an array of pixels arranged in columns and rows. The pixels 110 may include a plurality of imaging pixels and a plurality of phase difference detection pixels. Such imaging pixels and phase difference detection pixels may be interleaved in the pixel array 100. In some implementations, the phase difference detection pixels may be regularly or irregularly distributed in the pixel array 100.

In the pixel array 100, the imaging pixels may be arranged in a suitable color imaging pixel pattern for desired colors (e.g., red, green and blue) such that different colored imaging pixels are repeatedly arranged (e.g., colored pixels based on red pixels R-PX, green pixels G-PX, and blue pixels B-PX are repeatedly arranged). Such a color imaging pixel pattern may be, in some implementations, the Bayer pattern, for example. In the pixel array 100, the number of the phase difference detection pixels may be different from the number of the imaging pixels. In various implementations, the number of the phase difference detection pixels may be less than the number of the plurality of imaging pixels and such phase difference detection pixels are placed at certain locations within the pixel array 100 to perform desired phase detection for autofocusing or 3D imaging. In some implementations where there are more imaging pixels than the phase difference detection pixels, the imaging pixels may be arranged and interleaved with imaging pixels in the pixel array 100 such that one phase difference detection pixel may be surrounded or next to different imaging pixels. Conceptually, the arrangement of the phase difference detection pixels and imaging pixels in the pixel array 100 may be viewed by first having the pixel array 100 with all pixels occupied by imaging pixels and then selectively replacing some of the imaging pixels with phase difference detection pixels to form the final arrangement of the pixel array 100 with both imaging pixels and phase difference detection pixels.

In designing an image sensor for a particular application, the arrangement of imaging pixels and phase difference detection pixels in a pixel array 100 may be based on various considerations. For example, the locations of phase difference detection pixels in the pixel array 100 may be selected in consideration of imaging color qualities (e.g., undesired color shading in color reproduction by the image sensor) and/or fabrication of the semiconductor layers for forming the imaging pixels and the phase difference detection pixels. One example of the image color qualities is the undesired color shading in color reproduction in image sensors due to various factors, e.g., the presence of the imaging lens for directing incident light onto the imaging pixels, the non-uniform spectral responses of color filters over the pixel array 100, non-uniform spectral responses to light at different wavelengths by imaging pixels, or non-uniform pixel responses by imaging pixels. For example, in an imaging pixel arrangement with imaging pixels for respectively sensing red, blue and green colors in a Bayer pattern, the phase difference detection pixels may be placed at locations of certain blue pixels B-PX in the Bayer pattern. Specifically, each of the phase difference detection pixels may be placed at certain blue pixel locations and may include a blue filter B at such phase difference detection pixels. The consideration for this particular design of using certain blue pixels B-PX in the pixel array 100 as the phase difference detection pixels is that characteristic degradation caused by color shading can be reduced or prevented and that this particular design can facilitate an interpolation process for generating interpolated imaging pixel signal values for the phase difference detection pixels. In this regard, a red pixel R-PX may be disadvantageous as a location for placing a phase difference detection pixel because such a red pixel R-PX is inferior in a color shading characteristic to a blue pixel B-PX or a green pixel G-PX. Also, in the Bayer pattern, green pixels G-PX adjacent to a single green pixel G-PX are usually located in a diagonal direction relative to the single green pixel G-PX in the pixel array 100. Accordingly, the use of a green pixel G-PX as a phase difference detection pixel may be disadvantageous as pixel locations for placing phase difference detection pixels because it can be difficult to perform an interpolation process for generating interpolated imaging pixel signal values for the phase difference detection pixels.

The first embodiment describes an example in which the imaging pixels are arranged in the Bayer pattern, but the present disclosure is not limited to imaging pixels in the Bayer pattern and can be applied to other imaging pixel pattern arrangements. Although not illustrated in the drawing, in a different implementation example, an image sensor array may include white color sensing pixels each capable of sensing light at different wavelengths, e.g., wavelengths in at least a visible light spectrum and phase difference detection pixels may be configured to be placed at certain white pixel locations (not illustrated, instead of using locations of certain blue pixels B-PX for placing the phase difference detection pixels in the previous implementation example. In this example that uses certain white pixel locations for placing the phase difference detection pixels, the phase difference detection pixels may not have color filters. More specifically in this example, the region above such a phase difference detection pixel in which a color filter which would be present in an imaging pixel but is absent, is filled with a layer made of a material that is the same as that of a light-collecting element 206.

In yet another implementation example, the imaging pixels may be formed to include red pixels R-PX, green pixels G-PX, blue pixels B-PX, and white pixels that are repeatedly arranged across the imaging pixels. In this case, the phase difference detection pixels may be placed at certain locations for the white pixels.

In the image sensor in accordance with the first embodiment, each of the pixels 110 may include a photoelectric conversion element PD (e.g., a photodiode or a photogate). Photoelectric conversion elements PDs adjacent to each other may be isolated by a device isolation structure. In the illustrated example, the photoelectric conversion element PD and the device isolation structure may be formed in a substrate 200.

The substrate 200 may include a semiconductor substrate. The semiconductor substrate may be a suitable material state, e.g., in a single crystal state, and may include a material containing silicon in some implementations. Also, the substrate 200 may be a substrate thinned through a thinning process. For example, the substrate 200 may be or include a thin silicon single-crystal substrate.

The photoelectric conversion element PD that is formed in the substrate 200 so as to correspond to each of the pixels 110 may include a photodiode, a phototransistor, a photogate, or a combination thereof. For example, the photoelectric conversion element PD may include a photodiode. In some implementations, the photoelectric conversion element PD may comprise any one of an organic photodiode or an inorganic photodiode, or may be configured such that an organic photodiode and an inorganic photodiode are laminated.

The device isolation structure for isolating photoelectric conversion elements PD that are adjacent to each other may include an impurity region 202. Specifically, the device isolation structure may include a well that is formed in the substrate 200 so as to correspond to the pixel array 100. The conductivity type of the well may be P-type, and the photoelectric conversion element PD may be formed inside the well. Accordingly, the photoelectric conversion elements may be electrically isolated by the impurity region 202. In some implementations, a trench isolation structure, such as Shallow Trench Isolation (STI) or Deep Trench Isolation (DTI), may be used as the device isolation structure. The trench isolation structure may induce defects on the surface of the trench in the process of forming a trench in the substrate 200, and the defects formed on the surface of the trench may act as the source of a dark current, which degrades the characteristics of the image sensor. The degradation attributable to the trench isolation structure may be fundamentally prevented or reduced by using the impurity region 202 as the device isolation structure as in the first embodiment, as illustrated in the example in FIG. 2 in which the impurity region 202 is formed across the entire substrate 200.

Referring to FIG. 2, the image sensor in accordance with the first embodiment may include a grid pattern 204 formed over the substrate 200 along the boundaries of the pixels 110, a plurality of color filters for a red color (R), a green color (G), and a blue color (B) formed over the substrate 200 so as to correspond to the pixels 110, and light-collecting elements 206 formed over the color filters R, G, and B so as to respectively correspond to the pixels 110.

The grid pattern 204 operates to provide an optical isolation between pixels 110 that are adjacent to each other and prevent optical crosstalk. The grid pattern 204 may be formed over the surface of the substrate 200 corresponding to a light-receiving face or a light-incidence face of the photoelectric conversion element PD. In this example, the grid pattern 204 is intentionally located close to the photoelectric conversion element PD in order to more effectively reduce or prevent undesired optical crosstalk. Because the grid pattern 204 is formed along the boundaries of the pixels 110, the planar shape thereof may be configured as a mesh shape with openings 204A that are repetitively arranged in a plane. The grid pattern 204 may have a uniform thickness and line width regardless of the position thereof. Accordingly, the sizes or areas of openings 204A respectively provided to the pixels 110 by the grid pattern 204 may be equal to each other. In this specific design, the areas of light-receiving regions respectively provided to the pixels 110 by the grid pattern 204 may be equal to each other. The grid pattern 204 may include light-shielding material or light-absorbing material. The light-shielding material may include a material that reflects or absorbs light to shield light from the region below, and may include, in some implementations, a material that contains a metallic substance. A light-absorbing material for the light-shielding material may include a material that absorbs light, and may include silicon carbide (SiC), black-colored organic material, or others.

The color filters R, G, and B are formed over the substrate 200 so as to correspond to the pixels 110, and the edge of each of the color filters R, G, and B may be formed over the grid pattern 204. That is, the grid pattern 204 may be located between the substrate 200 and the color pixels R, G, and B. The color filters R, G, and B may have the same size as one another, and each of the color filters R, G, and B may be wider than that of an opening 204A provided by the grid pattern 204. Each of the color filters R, G, and B may include a single-layer filter or a multi-layer filter that is configured to include any one or at least two of a red filter, a green filter, a blue filter, a cyan filter, a yellow filter, a magenta filter, a white filter, a black filter, or an IR cutoff filter. For example, the color filters R, G, and B may include a red filter R, a green filter G, and a blue filter B. The light-collecting element 206 may include a digital lens or a hemispherical lens.

The image sensor in accordance with the first embodiment includes phase difference detection pixels for capturing incident light at different phase difference detection pixels to detect a phase of a captured image for implementing autofocusing and representing a three-dimensional representation of the captured image or scene. Some of the locations for the plurality of pixels 110 are selected for phase difference detection pixels. For example, in adjacent pixels 110 shown in FIG. 1, a pixel PX5 at a location of a blue pixel is fabricated as a phase difference detection pixel. The phase difference detection pixel PX5 may be formed over a substrate 200 such that the phase difference detection pixel PX5 may include a photoelectric conversion element PD for optical sensing for the phase difference detection, may abut on a grid pattern 204, and may include a phase difference pattern 208 having an open part 208A that allows incident light to enter the photoelectric conversion element PD for the optical sensing. Notably, the open part 208A is located away from the geometric center of the phase difference detection pixel PX5 or is eccentrically located within the phase difference detection pixel PX5. The eccentrically located open part 208A may deviate from a location of a symmetric axis in the photoelectric conversion element PD inside the phase difference detection pixel PX5 that is perpendicular to the plane of the photoelectric conversion element PD and passes through the geometric center of the phase difference detection pixel PX5, which may be referred to as the optical axis of the photoelectric conversion element PD. In some implementations, the open part 208A is formed on one side of the optical axis of the photoelectric conversion element PD. The space above the impurity region 202 and below the light-collecting device 206 in the phase difference detection pixel PX5 may be filled with different materials or structures depending on the specific structures of the device. For example, in a design where the phase difference detection pixel PX5 is placed at a location for a blue pixel in the Bayer pattern, this space may include a blue filter B and the blue filter B may gap-fill the open part 208A and cover the phase difference pattern 208. For another example, in a design where the phase difference detection pixel PX5 is placed at a location for a white pixel that does not normally have a color filter, the material used in the light-collecting device 206 in the phase difference detection pixel PX5 may gap-fill the space above the impurity region 202 and below the light-collecting device 206. The phase difference pattern 208 may be formed in the same level as the grid pattern 204. The phase difference pattern 208 may be formed together with the grid pattern 204 in the process of forming the grid pattern 204, and may be made of or include the same material as the grid pattern 204.

Referring to FIG. 1, a first direction D1 denotes a direction in which the open part 208A is eccentrically located from the geometric center of the phase difference detection pixel PX5, and a second direction D2 denotes a direction opposite to the direction D1. Also, a third direction D3 and a fourth direction D4 opposite to the third direction D3 are perpendicular to the first direction D1 or the second direction D2. In the example shown in FIG. 1, the first direction D1, the second direction D2, the third direction D3, and the fourth direction D4 are shown as the right, left, upward, and downward directions, respectively.

FIG. 2 shows a pixel PX1 that is adjacent to the phase difference detection pixel PX5 and operates as an imaging pixel for imaging. The first imaging pixel PX1 includes the open part 208A which is eccentrically located from the geometric center of the phase difference detection pixel PX5. Specifically as shown in FIG. 1, the first imaging pixel PX1 is located adjacent to the phase difference detection pixel PX5 but is shifted in position in the first direction D1. The first imaging pixel PX1 may be an imaging pixel at a green location in the Bayer pattern so that it includes a green filter G. This is intended to easily perform a follow-up interpolation process for the phase difference detection pixel in constructing the output image of the sensor array.

When the imaging pixel is located adjacent to the phase difference detection pixel, the characteristics of imaging pixels may be degraded due to reception of unintended incident light at an adjacent imaging pixel from the phase difference detection pixel. Particularly, as the area in the adjacent imaging pixel facing the light-receiving region of the phase difference detection pixel, that is, facing the eccentric open part 208A of the phase difference pattern 208, is larger in comparison with the light-receiving region of the adjacent phase difference detection pixel PX5, the characteristic degradation of the imaging pixel may be more severe due to optical crosstalk between the two adjacent pixels. In order to reduce or prevent this undesired optical crosstalk, the image sensor in accordance with the first embodiment may form the light-receiving area of the first imaging pixel PX1 that is adjacent to the phase difference detection pixel in the first direction D1, to be smaller than that of the imaging pixels surrounding the phase difference detection pixel, such that the smaller light-receiving area of the first imaging pixel PX1 along the first direction D1 receives less light to offset the increased light reception amount due to the additional light leakage from the adjacent phase difference detection pixel PX5. This design can reduce the overall image degradation by the optical crosstalk to the imaging signals produced by the imaging pixel PX1 that is adjacent to the phase difference detection pixel in the first direction D1 and other imaging pixels adjacent to the phase difference detection pixel PX5. Here, the reason why the light-receiving area of the first imaging pixel PX1 is formed so as to be smaller than that of the remaining adjacent imaging pixels is that the first imaging pixel PX1, which is adjacent to the phase difference detection pixel PX5 in the first direction D1 in which the open part 208A is eccentric, is most affected by optical crosstalk caused by the phase difference detection pixel PX5, among the imaging pixels adjacent to the same phase difference detection pixel PX5.

The first imaging pixel PX1 adjacent to the phase difference detection pixel PX5 along the first direction D1 may include a light-shield pattern 210 having a first open part 210A in the central part of the first imaging pixel PX1 while shielding light from the peripheral areas around the first open part 210A as a light-receiving area of the first imaging pixel PX1 which is smaller than a preset light-receiving area of an imaging pixel that does not include this light-shield pattern 210. Unlike the first imaging pixel PX1, other adjacent imaging pixels around the phase difference detection pixel PX5 have the preset light-receiving area which is larger than the area of an opening 204A of the grid pattern 204. The light-shield pattern 210 of the first imaging pixel PX1 may be formed over the substrate 200 so as to overlap the photoelectric conversion element PD of the first imaging pixel PX1, and may abut on the grid pattern 204. The light-shield pattern 210 of the first imaging pixel PX1 may have the shape of a ring and may have a uniform line width. Specifically, the light-shield pattern 210 may have a ring shape to include a peripheral area that blocks light and a central open part that allows transmission of light. Herein, the central open part may refer to the first open part 210A. The light-shield pattern 210 of the first imaging pixel PX1 may be formed in the same level as the grid pattern 204. The light-shield pattern 210 of the first imaging pixel PX1 may be formed along with the grid pattern 204 in the process of forming the grid pattern 204 during the fabrication, and may include the same material as the grid pattern 204. For example, the light-shield pattern 210 may include a light-shielding material which can be a light-reflecting material or a light-absorbing material. Also shown in the lower part of FIG. 1 is another phase difference detection pixel at a location of a blue pixel in the Bayer pattern and a corresponding adjacent imaging pixel that is shifted in the D2 direction due to the reverse orientation of its open part 208A and phase difference sensing pattern 208 in comparison to the phase difference detection pixel PX5. Similar to the first imaging pixel PX1, this adjacent imaging pixel shifted in the D2 direction includes the light-shield pattern 210 to produce a smaller light receiving area to offset the optical crosstalk.

Figure 3A:
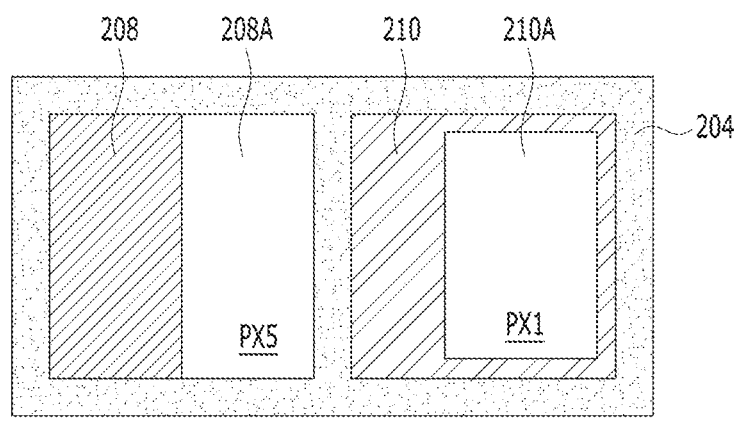
FIG. 3A and FIG. 3B are views illustrating modified examples of a light-shield pattern in an image sensor in accordance with embodiments.
Figure 3B:
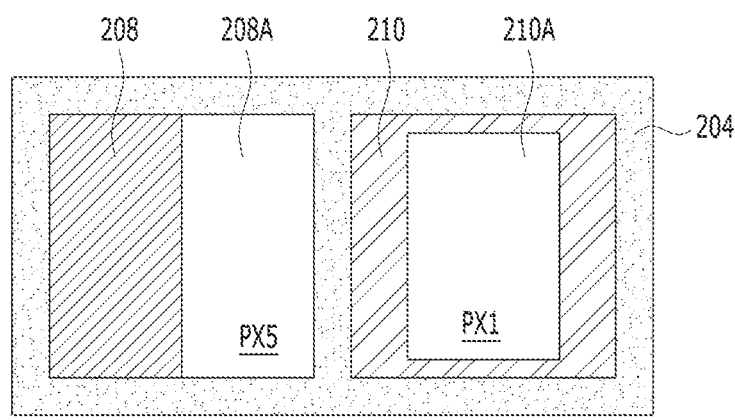

In the above example in FIGS. 1 and 2, the light-shield pattern 210 of the first imaging pixel PX1 has a uniform line width, but the present disclosure is not limited thereto. FIG. 3A and FIG. 3B shows another different implementation in which the light-shield pattern 210 may be formed to include two different regions, i.e., a first region and a second region, that have line widths different from each other. The light-shield pattern 210 may have a ring shape to include a peripheral area that blocks light and a central open part that allows transmission of light. The peripheral area includes a first region that is close to the phase difference detection pixel PX5 and a second region different from the first region, the first region having a line width wider than the second region. In other words, the first region that is close to the phase difference detection pixel PX5 therein have a wider line width than a second region that is not close thereto. For example, referring to FIG. 3A, the light-shield pattern 210 of an imaging pixel PX1 adjacent to the phase difference detection pixel PX5 is formed such that the first region that is closer to the phase difference detection pixel PX5 than the second region is has a wider line width. In FIG. 3A, the first region of the light-shield pattern 210 is located between the open part 208A and the first open part 210A and the second region of the light-shield pattern 210 is the remaining region except the first region. The second region may have a uniform line width which is smaller than that of the first region.

In another example shown in FIG. 3B, the first region of the light-shield pattern 210 of the imaging sensing pixel PX1 is located along the directions D1 and D2 from the first open part 210A and the second region of the light-shield pattern 210 is located along the directions D3 and D4 from the first open part. The first region has a line width greater than that of the second region. The first region may include the region that is closest to the phase difference detection pixel PX5 and the region that is farthest from the phase difference detection pixel PX5.

The image sensor in accordance with the first embodiment shown in the example in FIGS. 1 and 2 may include a light blocking layer 250 formed between the photoelectric conversion elements PDs of the adjacent phase difference detection pixel PX5 and the first imaging pixel PX1 in order to more effectively reduce or prevent optical crosstalk caused by the phase difference detection pixel PX5. This feature may be implemented in addition to the implementation of the technique for structuring the light-receiving area of the adjacent to the first imaging pixel PX1 to be smaller than the light-receiving area of some other imaging pixels shown in FIG. 1. The combination of both of those features can further reduce the undesired optical crosstalk. The light blocking layer 250 may include a light-shielding material that may include a light-reflecting or light-absorbing material. The light blocking layer 250 may be embedded in a trench 252 formed in the substrate 200. The trench 252 may be formed between the photoelectric conversion elements PD of the phase difference detection pixel PX5 and the first imaging pixel PX1. In some implementations, the bottom of the trench 252 may be located to be higher than that of the photoelectric conversion element PD. Viewed from the surface of the substrate 200 on which the light is received or the light is incident and thus operates as the light-receiving face or the light-incidence face, the height of the light blocking layer 250 may be less than the height of the photoelectric conversion element PD. This design can be used to minimize characteristic degradation attributable to defects on the surface of the trench 252 when the trench 252 is used for preventing optical crosstalk. The entrance of the trench 252 may be formed in the surface of the substrate 200 corresponding to the light-receiving face or the light-incidence face. Thus, the light blocking layer 250 may abut on the surface of the substrate 200 corresponding to the light-receiving face or the light-incidence face. Accordingly, the light blocking layer 250 may abut on the grid pattern 204, or may be located so as to be close to the grid pattern 204.

In the plan view, the light blocking layer 250 may have the shape of a bar having a long axis and a short axis. The long axis of the light blocking layer 250 may extend from the space between the adjacent imaging pixel PX1 and phase difference detection pixel PX5 in the third direction D3 and the fourth direction D4. The opposite ends of the light blocking layer 250 may be positioned between the pixels 110 that are adjacent to the phase difference detection pixel PX5 and the first imaging pixel PX1 in the third direction D3 and the fourth direction D4.

In the plan view, the eccentrically located open part 208A of the phase difference pattern 208 may also have the shape of a bar having a long axis and a short axis, and the long axis of the eccentrically located open part 208A may also extend in the third direction D3 and the fourth direction D4. Here, in order to more effectively prevent optical crosstalk between the phase difference detection pixel PX5 and the first imaging pixel PX1, the length of the long axis of the light blocking layer 250 may be greater than the length of the long axis of the open part 208A. As described above, the opposite ends of the light blocking layer 250 may be located between the pixels 110 that are adjacent to the phase difference detection pixel PX5 and the first imaging pixel PX1 in the third direction D3 and the fourth direction D4. The opposite ends of the light blocking layer 250 may abut on portions of the sidewalls of the photoelectric conversion elements PDs of the pixels 110 that are adjacent to the phase difference detection pixel PX5 and the first imaging pixel PX1 in the third direction D3 and the fourth direction D4.

The first embodiment describes an example in which the light blocking layer 250 is formed as the shape of a bar between the adjacent imaging pixel PX1 and phase difference detection pixel PX5, but the present disclosure is not limited thereto. For example, FIGS. 4A to 4E show various configurations of the light blocking layer 250 is formed on at least one of sidewalls of the photoelectric conversion element PD of the first imaging pixel PX1 and at least one of sidewalls of the photoelectric conversion element of the phase difference detection pixel PX5. As illustrated in FIGS. 4A to 4E, the light blocking layer 250 is formed between the photoelectric conversion elements PDs of the adjacent imaging pixel PX1 and phase difference detection pixel PX5. In addition to the area between the photoelectric conversion elements PDs of the first imaging pixel PX1 and the phase difference detection pixel PX5, the light blocking layer 250 can be formed to extend to other areas, e.g., partially covering the sidewall or sidewalls of the photoelectric conversion element PD of the first imaging pixel, completely surrounding the sidewalls of the photoelectric conversion element of the first imaging pixel PX1, partially covering a sidewall or sidewalls of the photoelectric conversion element PD of the phase difference detection pixel PX5, or completely surrounding the sidewalls of the photoelectric conversion element of the phase difference detection pixel PX5.

Figure 4A:
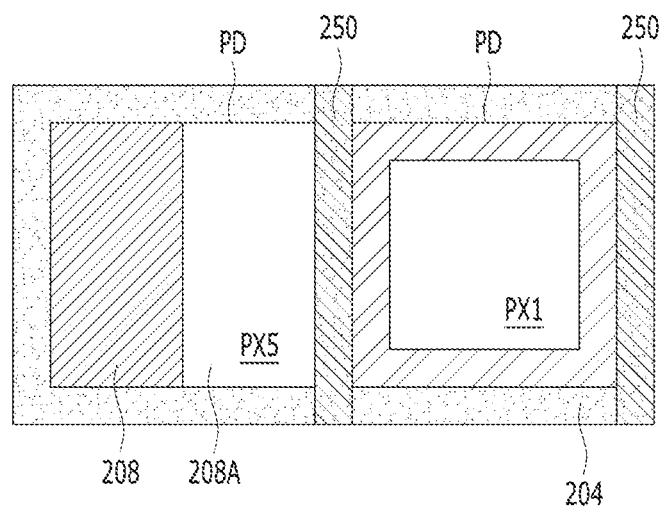
FIGS. 4A to 4E are plan views illustrating modified examples of a light blocking layer in an image sensor in accordance with embodiments.

For example, referring to FIG. 4A, the light blocking layer 250 may be formed on the opposite sides of the photoelectric conversion element PD of the imaging pixel PX1 such that it partially surrounds the sidewall of the photoelectric conversion element PD of the first imaging pixel PX1.

Figure 4B:
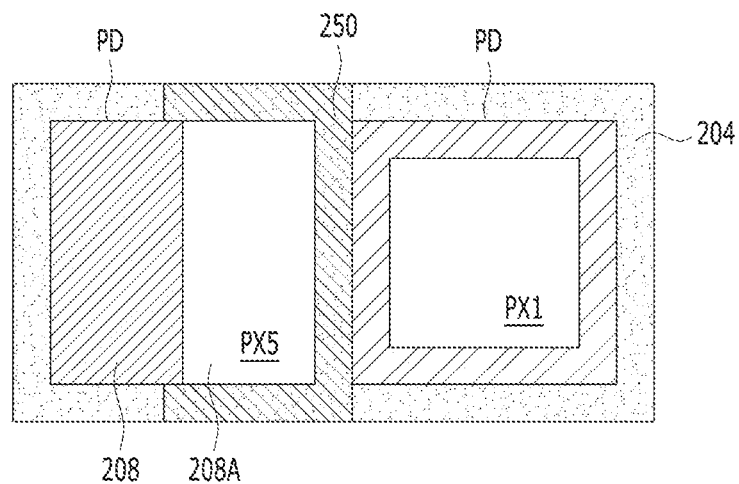

In another example, referring to FIG. 4B, the light blocking layer 250 may surround a portion of the sidewall of the photoelectric conversion element PD of the phase difference detection pixel PX5 which corresponds to the eccentrically located open part 208A.

Figure 4C:
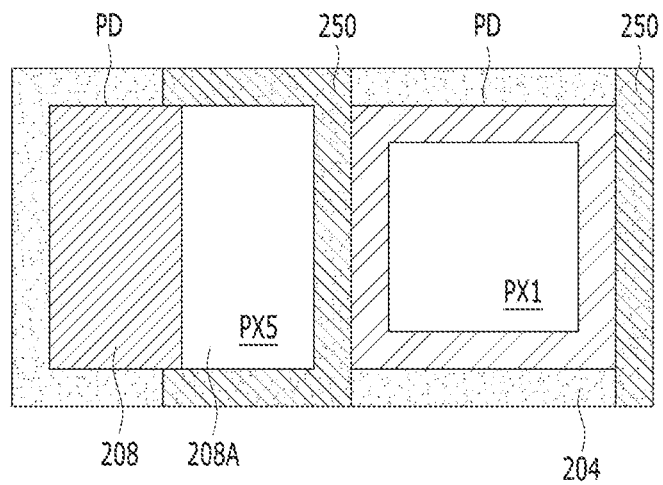

In another example, referring to FIG. 4C, the light blocking layer 250 may be formed to have a combined shape of the light blocking layers 250 illustrated in FIG. 4A and FIG. 4B. In FIG. 4C, the light blocking layer 250 is formed on the opposite sides of the photoelectric conversion element PD of the first imaging pixel PX1 such that it partially surrounds the sidewall of the photoelectric conversion element PD of the first imaging pixel PX1 and the light blocking layer 250 is also extended such that a portion of the sidewall of the photoelectric conversion element PD of the phase difference detection pixel PX5 corresponding to the eccentrically located open part 208A is surrounded by the light blocking layer 250.

Figure 4D:
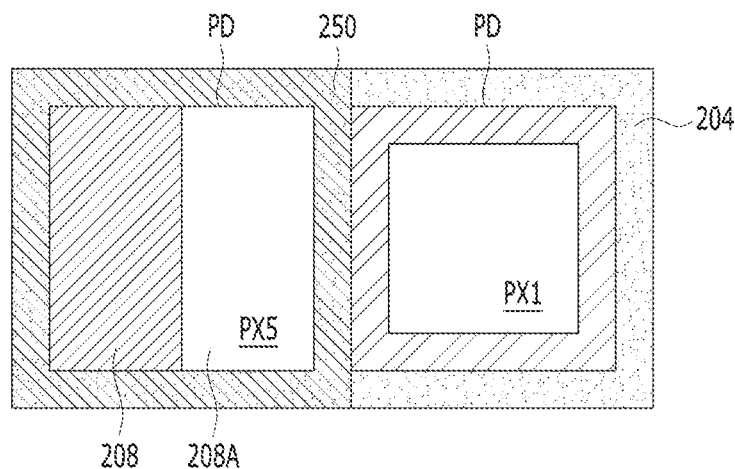

In another example, referring to FIG. 4D, the light blocking layer 250 may be extended such that it completely surrounds the sidewall of the photoelectric conversion element PD of the phase difference detection pixel PX5.

Figure 4E:
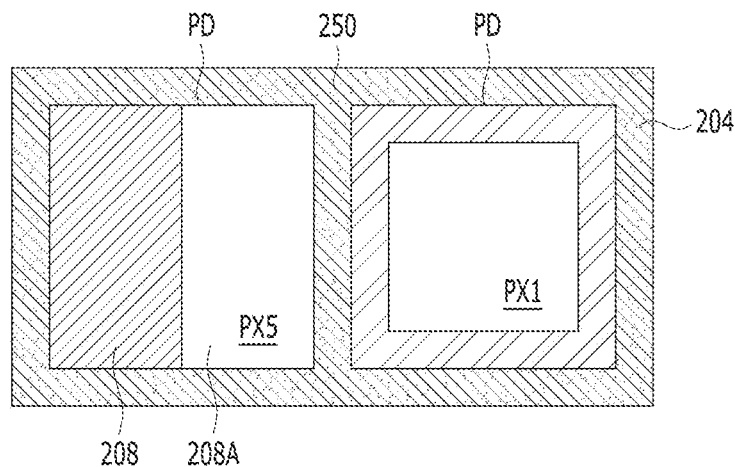

In yet another example, referring to FIG. 4E, the light blocking layer 250 may be extended such that it completely surrounds both the sidewalls of the photoelectric conversion elements PD of the adjacent imaging pixel PX1 and phase difference detection pixel PX5.

As described above, the image sensor in accordance with the first embodiment forms a light-shield pattern suitable for controlling the light-receiving area of the imaging pixel adjacent to the phase difference detection pixel, thereby preventing characteristic degradation caused by optical crosstalk between the pixels.

The image sensor in accordance with the first embodiment forms the light blocking layer 250 so as to be embedded in the trench 252 formed between the photoelectric conversion elements PD of the phase difference detection pixel and the imaging pixel, thereby preventing characteristic degradation caused by optical crosstalk between the phase difference detection pixel and the imaging pixel. Furthermore, because the trench 252 for the light blocking layer 250 is formed in a portion of the region between the phase difference detection pixel and the imaging pixel, characteristic degradation caused by the trench 252 can be minimized.

Figure 5:
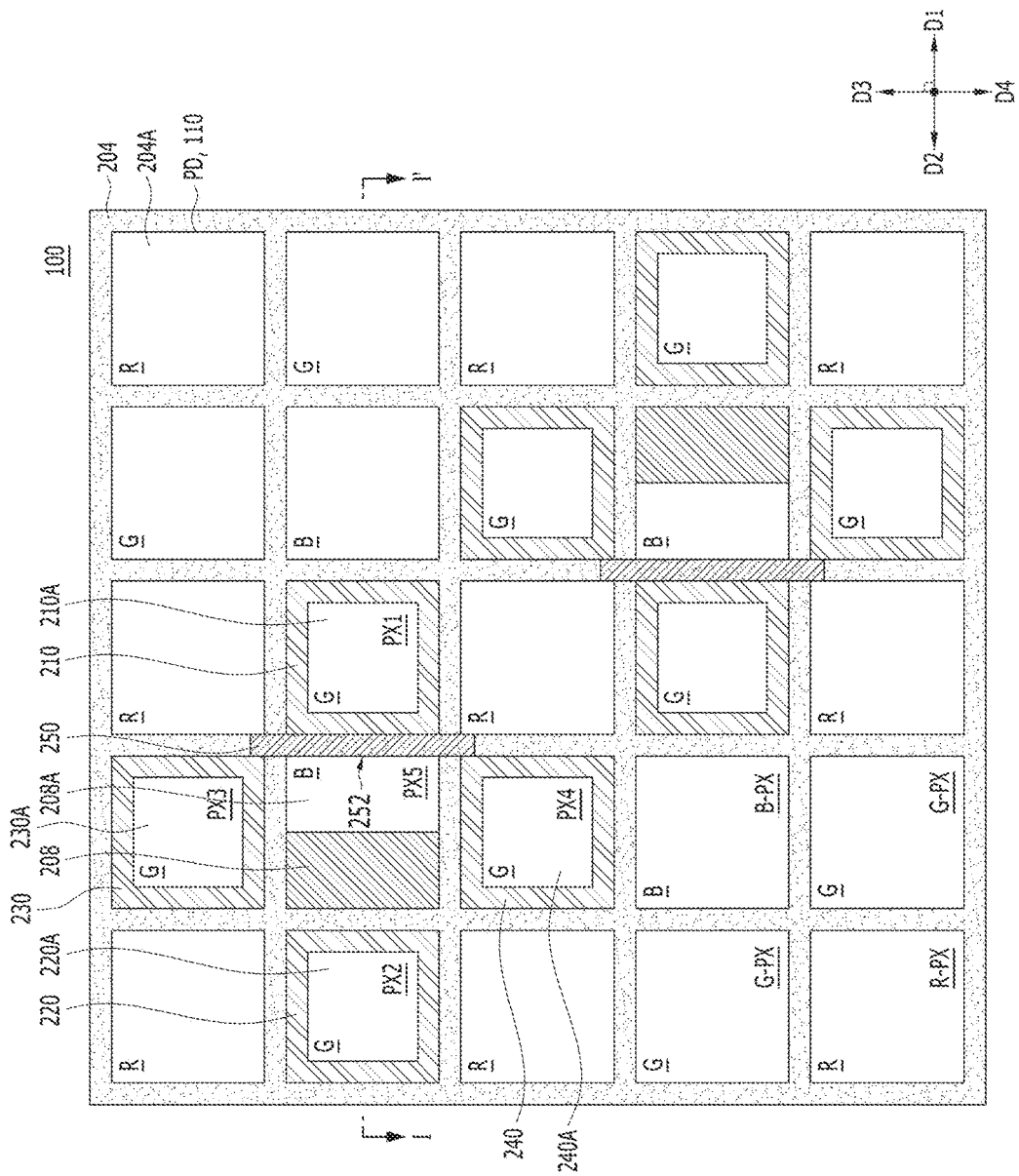
FIG. 5 and FIG. 6 are views illustrating an exemplary image sensor in accordance with a second embodiment of the present disclosure.
Figure 6:
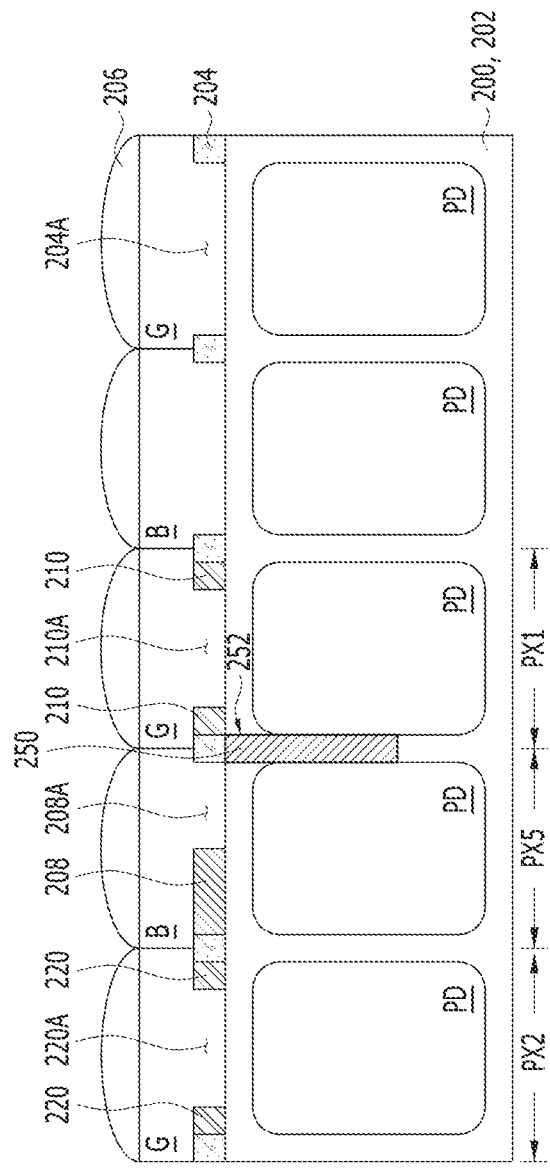

FIG. 5 and FIG. 6 are views illustrating an example of an image sensor in accordance with the second embodiment of the present disclosure. Specifically, FIG. 5 is a plan view illustrating a part of a pixel array, and FIG. 6 is a cross-sectional view illustrating a cross section cut along the dotted line I-I' shown in FIG. 5. Hereinafter, for the convenience of description, a description will focus on a difference from the image sensor in accordance with the first embodiment. Also, the same reference numerals will be used to designate the same parts as in the first embodiment, and a detailed description of the same parts will be omitted.

As illustrated in FIG. 5 and FIG. 6, the image sensor in accordance with the second embodiment may include a phase difference detection pixel PX5 having an eccentrically located open part 208A and a plurality of adjacent imaging pixels surrounding the phase difference detection pixel PX5. Among the adjacent imaging pixels around the phase difference detection pixel PX5, a first pixel PX1 is adjacent to the phase difference detection pixel PX5 in the direction D1 such that the first imaging pixel PX1 is closer to the open part 208A of the phase difference pattern 208 than the remaining part of the phase different pattern 208. Referring to FIG. 5, imaging pixels sensing the same color as the color sensed by the first imaging pixel PX1 may have a light-receiving area that is smaller than that of imaging pixels sensing a color that differs from the color sensed by the first imaging pixel PX1.

In the image sensor in accordance with the second embodiment, any one of the plurality of pixels 110 in the pixel array 100, for example, a pixel PX5 may be selected as one of phase difference detection pixels in the pixel array 100. The phase difference detection pixel PX5 may be formed over a substrate 200 such that it includes a photoelectric conversion element PD, may abut on a grid pattern 204, and may include a phase difference pattern having an open part 208A that is eccentrically located. The eccentrically located open part 208A may deviate from the optical axis of the photoelectric conversion element PD. The phase difference detection pixel PX5 may include a blue filter B, or may not have a color filter. When the phase difference detection pixel PX5 includes a blue filter B, the blue filter B may gap-fill the open part 208A and cover the phase difference pattern 208. When the phase difference detection pixel PX5 phase difference detection pixel PX5 does not have a color filter, a light-collecting device 206 may gap-fill a region for forming a color filter. The phase difference pattern 208 may be formed in the same level as the grid pattern 204. The phase difference pattern 208 may be formed together with the grid pattern 204 in the process of forming the grid pattern 204, and may be made of or include the same material. For reference, the first direction D1 to the fourth direction D4 may be the same as explained for the first embodiment in relation to FIG. 1.

The example image sensor for the second embodiment in FIGS. 5 and 6 includes adjacent imaging pixels including the first imaging pixel PX1, the second imaging pixel PX2, the third imaging pixel PX3, and the fourth imaging pixel PX4 that are adjacent to the phase difference detection pixel PX5 in the first direction D1, the second direction D2, the third direction D3, and the fourth direction D4, respectively. The first to fourth imaging pixels PX1 to PX4 may sense the same color in the Bayer pattern, for example, and accordingly, the first to fourth imaging pixels PX1 to PX4 may include the same color filer. For example, the first to fourth imaging pixels PX1 to PX4 may include a green filter G. This arrangement is intended to easily perform a follow-up interpolation process to produce an interpolated imaging signal value for the phase difference detection pixel PX5 based on imaging pixel signals from adjacent imaging pixels.

The characteristics of the first to fourth imaging pixels PX1 to PX4 adjacent to the phase difference detection pixel PX5 may be degraded due to unintended incident light flowing or introduced from the phase difference detection pixel PX5 into the first to fourth imaging pixels PX1 to PX4. Particularly, as the area of the imaging pixel pattern which faces the light receiving region of the phase difference detection pixel PX5, i.e., the area of the imaging pixel pattern facing the eccentrically located open part 208A of the phase difference pattern 208 is larger, the characteristic degradation of the imaging pixel may be more severe due to optical crosstalk. In order to prevent or reduce the characteristic degradation of the imaging pixel which is located adjacent to the phase difference detection pixel, the image sensor in accordance with the second embodiment may form the light-receiving area of the first to fourth imaging pixels PX1 to PX4 that are adjacent to the phase difference detection pixel PX5 in the first to fourth directions D1 to D4 to be smaller than that of the remaining imaging pixels including the imaging pixels that are arranged to be adjacent to the phase difference detection pixel PX5 in a diagonal direction. The first to fourth imaging pixels PX1 to PX4 are more affected by optical crosstalk caused by the phase difference detection pixel PX 5 than the remaining imaging pixels that are located to be adjacent to the phase difference detection pixel PX5 in a diagonal direction relative to the phase difference detection pixel PX5.

The first to fourth imaging pixels PX1 to PX4 may include first to fourth light-shield patterns 210 to 240, respectively. The first to fourth light-shield patterns 210 to 240 may include first to fourth open parts 210A to 240A, respectively, such that the first to fourth imaging pixels PX1 to PX4 have a light-receiving area that is smaller than a preset light-receiving area. The areas of the first to fourth open parts 210A to 240A may be the light-receiving areas of the first to fourth imaging pixels PX1 to PX4, respectively, and the preset light-receiving area may be the area of an opening 204A of the grid pattern 204. The first to fourth light-shield patterns 210 to 240 may have the shape of a ring. Each of the first to fourth light-shield patterns 210 to 240 may have a ring shape to include a peripheral area that blocks light and a central open part that allows transmission of light. Herein, the central open part may refer to each of the first to fourth open parts 210A to 240A. In some implementations, each of the first to fourth light-shield patterns 210 to 240 has a uniform line width. In some implementations, at least one of the first to fourth light-shield patterns 210 to 240 has a non-uniform line widths. Each of the first to fourth light-shield patterns 210 to 240 may have a ring shape to include a peripheral area that blocks light and a central open part that allows transmission of light. The peripheral area includes a first region that is close to the phase difference detection pixel PX5 and a second region different from the first region, the first region having a line width wider than the second region. For example, at least one of the first to fourth light-shield patterns 210 to 240 may include a first region and a second region, the first region closer to the phase difference detection pixel PX5 than the second region is, and the first region may have a relatively wider line width than the second region. The first to fourth light-shield patterns 210 to 240 may have the same shape, or may have different shapes. For example, each of the first to fourth light-shield patterns 210 to 240 may have the shape illustrated in FIG. 3A and FIG. 3B. The first to fourth light-shield patterns 210 to 240 may be formed in the same level as the grid pattern 204. The first to fourth light-shield patterns 210 to 240 may be formed together with the grid pattern 204 in the process of forming the grid pattern 204, and may include the same material. The first to fourth light-shield patterns 210 to 240 may include light-shielding material or light-absorbing material.

The first light-shield pattern 210 may be formed over the substrate 200 so as to overlap the photoelectric conversion element PD of the first imaging pixel PX1, may abut on the grid pattern 204, and may have the first open part 210A. The area of the first open part 210A may be the light-receiving area of the first imaging pixel PX1, and may be smaller than the preset light-receiving area. The second light-shield pattern 220 may be formed over the substrate 200 so as to overlap the photoelectric conversion element PD of the second imaging pixel PX2, may abut on the grid pattern 204, and may have the second open part 220A. The area of the second open part 220A may be the light-receiving area of the second imaging pixel PX2, and may be smaller than the preset light-receiving area. The third light-shield pattern 230 may be formed over the substrate 200 so as to overlap the photoelectric conversion element PD of the third imaging pixel PX3, may abut on the grid pattern 204, and may have the third open part 230A. The area of the third open part 230A may be the light-receiving area of the third imaging pixel PX3, and may be smaller than the preset light-receiving area. The fourth light-shield pattern 240 may be formed over the substrate 200 so as to overlap the photoelectric conversion element PD of the fourth imaging pixel PX4, may abut on the grid pattern 204, and may have the fourth open part 240A. The area of the fourth open part 240A may be the light-receiving area of the fourth imaging pixel PX4, and may be smaller than the preset light-receiving area. The area of the fourth open part 240A may be equal to the area of the third open part 230A.

The first to fourth open parts 210A to 240A may have an equal area. Alternatively, the first to fourth open parts 210A to 240A may have different sizes. For example, the area of the first open part 210A may be the smallest, and the areas of the second to fourth open parts 220A to 240A may be equal to each other. Alternatively, the area of the first open part 210A may be the smallest, the area of the second open part 220A may be the largest, and the areas of the third open part 230A and the fourth open part 240A may be equal to each other. The areas of the first to fourth open parts 210A to 240A are not equal to each other, since the amount of incident light flowing or introduced from the phase difference detection pixel PX5 to the first to fourth imaging pixels PX1 to PX4 differs depending on the position of the light-receiving region of the phase difference detection pixel PX5, that is, the position of the open part 280A of the phase difference pattern 208. By adjusting the areas of the first to fourth open parts 210A to 240A, the output signals of the first to fourth imaging pixels PX1 to PX4 configured to sense the same color can be adjusted to have similar strength. For reference, when the output signals of the first to fourth imaging pixels PX1 to PX4, which are adjacent to the phase difference detection pixel PX5 phase difference detection pixel PX5 and are configured to sense the same color, have similar strength, the characteristics of the interpolation process for the phase difference detection pixel PX5 phase difference detection pixel PX5 can be improved.

When the first to fourth open parts 210A to 240A have an equal area, the first to fourth light-shield patterns 210 to 240 may have different shapes in order to offset the difference in the amount of incident light flowing or introduced from the phase difference detection pixel PX5 to the first to fourth imaging pixels PX1 to PX4. For example, the second to fourth light-shield patterns 220 to 240 may have the same shape, and the first light-shield pattern 210 may have a shape that differs from the shape of the second to fourth light-shield patterns 220 to 240. For example, the first to fourth light-shield patterns 210 to 240 have the shape of a ring, and the second to fourth light-shield patterns 220 to 240 have a uniform line width. In this case, the first light-shield pattern 210 may be formed such that a region close to the phase difference detection pixel PX5 phase difference detection pixel PX5 has a line width that is relatively wider than that of a remaining region that is not close to the phase difference detection pixel PX5.

The image sensor in accordance with the second embodiment may include a light blocking layer 250 formed at least between the photoelectric conversion elements PDs of the phase difference detection pixel PX5 and the first imaging pixel PX1 in order to more effectively prevent optical crosstalk caused by the phase difference detection pixel PX5. The reason why the light blocking layer 250 is formed between the photoelectric conversion elements PDs of the phase difference detection pixel PX5 and the first imaging pixel PX1 is that the first imaging pixel PX1 is most affected by optical crosstalk caused by the phase difference detection pixel PX5 as compared to other pixels.

The light blocking layer 250 may include light-shielding material or light-absorbing material. The light blocking layer 250 may be embedded in a trench 252 formed in the substrate 200. The trench 252 may be formed between the photoelectric conversion elements PDs of the phase difference detection pixel PX5 and the first imaging pixel PX1. In some implementations, the bottom of the trench 252 may be located to be higher than that of the photoelectric conversion element PD. Viewed from the surface of the substrate 200 on which the light is received or the light is incident and thus operates as the light-receiving face or the light-incidence face, the height of the light blocking layer 250 may be less than the height of the photoelectric conversion element PD. This will help to minimize characteristic degradation attributable to defects on the surface of the trench 252 when the trench 252 is used for preventing optical crosstalk. The entrance of the trench 252 may be formed in the surface of the substrate 200 corresponding to the light-receiving face or the light-incidence face. Thus, the light blocking layer 250 may abut on the surface of the substrate 200 corresponding to the light-receiving face or the light-incidence face. Accordingly, the light blocking layer 250 may abut on the grid pattern 204, or may be located so as to be close to the grid pattern 204.

In the plan view, the light blocking layer 250 may have the shape of a bar having a long axis and a short axis. The long axis of the light blocking layer 250 may extend from the space between the first imaging pixel PX1 and the phase difference detection pixel PX5 in the third direction D3 and the fourth direction D4. The opposite ends of the light blocking layer 250 may be positioned between the pixels 110 that are adjacent to the phase difference detection pixel PX5 and the first imaging pixel PX1 in the third direction D3 and the fourth direction D4.

In the plan view, the eccentrically located open part 208A of the phase difference pattern 208 may also have the shape of a bar having a long axis and a short axis, and the long axis of the eccentrically located open part 208A may also extend in the third direction D3 and the fourth direction D4. Here, in order to more effectively prevent optical crosstalk between the phase difference detection pixel PX5 and the first imaging pixel PX1, the length of the long axis of the light blocking layer 250 may be greater than the length of the long axis of the open part 208A. As discussed above, the opposite ends of the light blocking layer 250 may be located between the pixels 110 that are adjacent to the phase difference detection pixel PX5 and the first imaging pixel PX1 in the third direction D3 and the fourth direction D4. The opposite ends of the light blocking layer 250 may abut on portions of the sidewalls of the photoelectric conversion elements PDs of the pixels 110 that are adjacent to the phase difference detection pixel PX5 and the first imaging pixel PX1 in the third direction D3 and the fourth direction D4.

The second embodiment describes an example in which the light blocking layer 250 is formed as the shape of a bar between the first imaging pixel PX1 and the phase difference detection pixel PX5, but the present disclosure is not limited thereto. For example, FIGS. 4A to 4E show various configurations of the light blocking layer 250 is formed on at least one of sidewalls of the photoelectric conversion element PD of the first imaging pixel PX1 and at least one of sidewalls of the photoelectric conversion element of the phase difference detection pixel PX5. As illustrated in FIGS. 4A to 4E, the light blocking layer 250 is formed between the photoelectric conversion elements PDs of the first imaging pixel PX1 and the phase difference detection pixel PX5. In addition to the area between the photoelectric conversion elements PDs of the first imaging pixel PX1 and the phase difference detection pixel PX5, the light blocking layer 250 can be formed to extend to other areas, e.g., partially covering the sidewall or side walls of the photoelectric conversion element PD of the first imaging pixel, completely surrounding the sidewalls of the photoelectric conversion element of the first imaging pixel PX1, partially covering a sidewall or sidewalls of the photoelectric conversion element PD of the phase difference detection pixel PX5, or completely surrounding the sidewalls of the photoelectric conversion element of the phase difference detection pixel PX5.

As described above, the image sensor in accordance with the second embodiment forms a light-shield pattern configured to control the light-receiving area of the imaging pixel adjacent to the phase difference detection pixel, thereby preventing characteristic degradation caused by optical crosstalk.

Also, the image sensor in accordance with the second embodiment forms the light blocking layer 250 so as to be embedded in the trench 252 formed between the photoelectric conversion elements PDs of the phase difference detection pixel and an adjacent imaging pixel, thereby effectively preventing characteristic degradation caused by optical crosstalk between the pixels. Furthermore, because the trench 252 for the light blocking layer 250 is formed in a portion of the region between the phase difference detection pixel and the imaging pixel, characteristic degradation attributable to the trench 252 can be minimized.

In addition, a light blocking layer can be formed between the photoelectric conversion elements PDs of the phase difference detection pixel PX5 and another adjacent imaging pixel PX2, PX3 or PX4 to further reduce the undesired optical crosstalk. This feature of providing a light blocking layer between the photoelectric conversion elements PDs of the phase difference detection pixel PX5 and an adjacent imaging pixel next to the PX5 may be implemented in addition to the implementation of the technique for structuring the light-receiving area of an adjacent imaging pixel to be smaller than the light-receiving area of some other imaging pixels shown in FIG. 5. The combination of both of those features can further reduce the undesired optical crosstalk.

Figure 7:
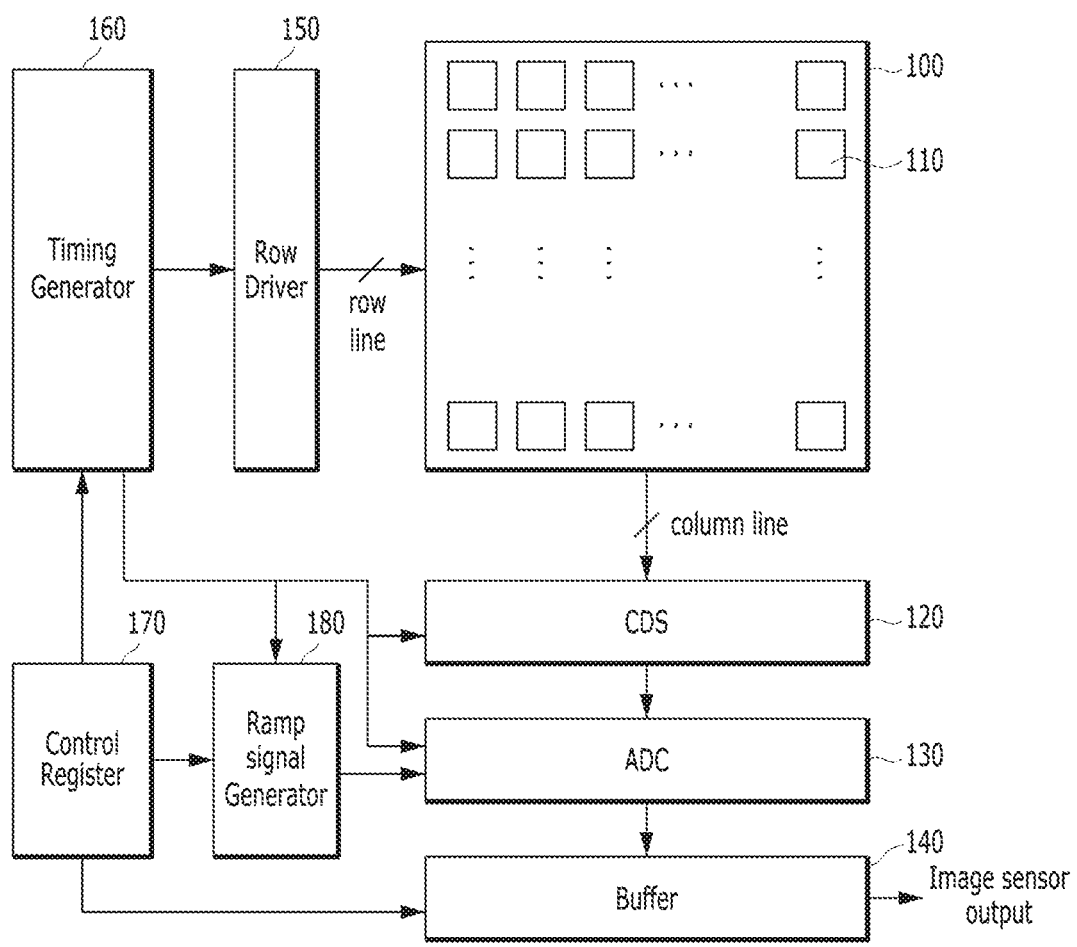
FIG. 7 is a block diagram schematically illustrating a representation of an example of an image sensor based on an embodiment of the present disclosure.

FIG. 7 is a block diagram schematically illustrating a representation of an example of an image sensor based on an embodiment of the present disclosure.

As shown in FIG. 7, the image sensor may include a pixel array 100, a correlated double sampling (CDS) 120, an analog-digital converter (ADC) 130, a buffer 140, a row driver 150, a timing generator 160, a control register 170, and a ramp signal generator 180. The plurality of pixels 110 may be arranged in a matrix structure. The plurality of pixels 110 may include a plurality of imaging pixels and a plurality of phase difference detection pixels.

The timing generator 160 generates one or more control signals for controlling the respective operations of the row driver 150, the correlated double sampling (CDS) 120, the analog-digital converter (ADC) 130 and the ramp signal generator 180. The control register 170 generates one or more control signals for controlling the respective operations of the ramp signal generator 180, the timing generator 160 and the buffer 140.

The row driver 150 is coupled to the pixel array 100 through a row line. The row driver 150 drives the pixel array 100 with the row line. For example, the row driver 150 may generate a select signal for selecting a particular row line among a plurality of row lines. The plurality of row lines are coupled with the plurality of pixels 110, respectively. One row line is coupled to each of the plurality of pixels 110.

The correlated double sampling 120 is coupled to the pixel array 150 through column lines. Each of the plurality of pixels 110 senses incident light, and outputs an image reset signal and an image signal to the correlated double sampling 120 through a column line. The correlated double sampling 120 performs sampling for each of the image reset signal and the image signal that are received from the pixel array 100. The plurality of pixels 110 are coupled to a plurality of column lines, respectively. One column line is coupled to each of the plurality of pixels 110. The analog-digital converter 130 is coupled with the correlated double sampling 120 and the ramp signal generator 180. The analog-digital converter 130 is configured to receive a sampling signal and a ramp signal from the correlated double sampling 120 and the ramp signal generator 180, respectively, compare the ramp signal which is outputted from the ramp signal generator 180 with the sampling signal which is outputted from the correlated double sampling 120, and output a comparison signal. In some implementations, the analog-digital converter 130 is coupled to the timing generator 160 which provides a clock signal to the analog-digital converter 130. The analog-digital converter 130 counts a level transition time of the comparison signal using the clock signal which is provided from the timing generator 160, and outputs a count value to the buffer 140. In some implementations, the timing generator is further coupled to the ram signal generator 180 and the ramp signal generator 180 may operate under control of the timing generator 160.

The buffer 140 is coupled to the analog-digital converter 130 to receive digital signals from the analog-digital converter 130. In some implementations, the buffer 140 may include a memory (not shown) and a sense amplifier (not shown). The buffer 140 stores digital signals which are outputted from the analog-digital converter 130. In some implementations, the memory of the buffer 140 stores the count values that are counted by and provided from the analog-digital converter 130. The count values may be associated with the signals outputted from the plurality of pixels 110. The buffer 140 is further configured to sense and amplify the stored digital signals, and outputs the amplified resultant signals. The sense amplifier of the buffer 140 is structured to sense and amplify the respective count values which are outputted from the memory.

The image sensor in accordance with the above-described embodiments can be used in various electronic devices or systems. Hereafter, a case in which the image sensor in accordance with the embodiments is applied to a camera will be described with reference to FIG. 8.

Figure 8:
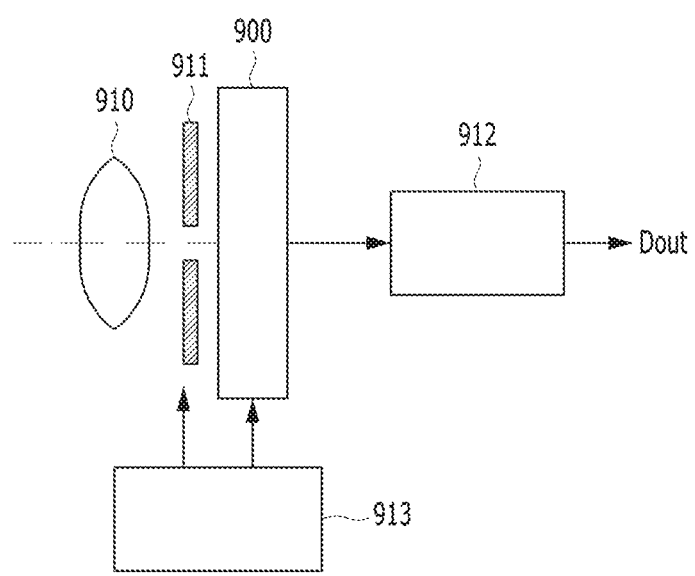
FIG. 8 is a diagram schematically illustrating a representation of an example of an electronic device including an image sensor based on an embodiment of the present disclosure.

FIG. 8 is a diagram schematically illustrating a representation of an example of an electronic device including the image sensor based on an embodiment of the disclosed technology.

Referring to FIG. 8, the electronic device including the image sensor based on the embodiment of the disclosed technology may be a camera capable of taking a still image or a moving picture. The electronic device may include an optical system (or optical lens) 910, a shutter unit 911, an image sensor 900, a driving unit 913 for controlling/driving the image sensor 900 and the shutter unit 911, and a signal processing unit 912.

The optical system 910 guides image light (incident light) from an object, to a pixel array (see the reference numeral 100 of FIG. 1 and FIG. 5) of the image sensor 900. The optical system 910 may be constructed by a plurality of optical lenses. The shutter unit 911 controls a light irradiation period and a light shielding period for the image sensor 900. The driving unit 913 controls the transmission operation of the image sensor 900 and the shutter operation of the shutter unit 911. The signal processing unit 912 performs various kinds of signal processing for the signal outputted from the image sensor 900. An image signal Dout after signal processing may be stored in a storage medium such as a memory or be outputted to a monitor or the like.

According to the present disclosure based on the above-described solution, a light-shield pattern is formed to control the amount of incident light by adjusting the light-receiving area of an imaging pixel. The light-shield pattern is formed to be adjacent to a phase difference detection pixel, and thus characteristic degradation caused by optical crosstalk between the pixels can be prevented.

In some implementations, a light blocking layer is embedded in a trench formed between the photoelectric conversion elements of the phase difference detection pixel and the imaging pixel. Accordingly, characteristic degradation caused by optical crosstalk can be more effectively prevented.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments. Only a few implementations and examples are described. Other implementations, enhancements and variations can be made based on what is described and illustrated in this patent document.

What is claimed is:

1. An image sensor, comprising:
a plurality of imaging pixels located at different locations to receive incident light and to produce pixel signals representing respectively received portions of the incident light for forming an image, each imaging pixel including a light-receiving area that receives a portion of the incident light and a photoelectric conversion element to convert received portion of incident into a pixel signal associated with part of the image; and
a phase difference detection pixel located amongst the plurality of imaging pixels and structured to include an open part which receives a portion of the incident light and a photoelectric conversion element to convert the received light into a phase difference detection pixel signal for optical sensing of a phase of the image formed by the pixel signals from the plurality of the imaging pixels, wherein the open part is eccentrically located in the phase difference detection pixel in a first direction,
wherein the plurality of imaging pixels include a first imaging pixel that is adjacent to the phase difference detection pixel in the first direction and senses a first color, a first imaging pixel group for sensing the first color, and a second imaging pixel group for sensing different colors from the first color,
wherein each of the first imaging pixel and the first imaging pixel group has a light-receiving area smaller than a light-receiving area of each of the second imaging pixel group.

2. The image sensor of claim 1, further comprising:
a light blocking layer formed between the photoelectric conversion element of the phase difference detection pixel and a photoelectric conversion element of the first imaging pixel to reduce optical crosstalk.

3. The image sensor of claim 2, wherein the light blocking layer is formed on at least one of sidewalls of a photoelectric conversion element of the first imaging pixel.

4. The image sensor of claim 2, wherein the light blocking layer is formed on at least one of sidewalls of the photoelectric conversion element of the phase difference detection pixel.

5. The image sensor of claim 1, wherein, among the plurality of imaging pixels, the first imaging pixel group include a second imaging pixel that is adjacent to the phase difference detection pixel in a second direction, which is opposite to the first direction.

6. The image sensor of claim 5, wherein the light-receiving area of the first imaging pixel is substantially equal to a light-receiving area of the second imaging pixel.

7. The image sensor of claim 5, wherein the light-receiving area of the first imaging pixel is smaller than a light-receiving area of the second imaging pixel.

8. The image sensor of claim 1, wherein:
the first imaging pixel group include a second imaging pixel that is adjacent to the phase difference detection pixel in a second direction, which is opposite to the first direction, a third imaging pixel that is adjacent to the phase difference detection pixel in a third direction, which is crossing the first direction, and a fourth imaging pixel that is adjacent to the phase difference detection pixel in a fourth direction, which is opposite to the third direction, and
the light-receiving areas of the first to fourth imaging pixels are substantially equal to each other.

9. The image sensor of claim 1, wherein:
the first imaging pixel group include a second imaging pixel that is adjacent to the phase difference detection pixel in a second direction, which is opposite to the first direction, a third imaging pixel that is adjacent to the phase difference detection pixel in a third direction, which is crossing the first direction, and a fourth imaging pixel that is adjacent to the phase difference detection pixel in a fourth direction, which is opposite to the third direction, and
the light-receiving area of the first imaging pixel is the smallest, and light-receiving areas of the second to fourth imaging pixels are substantially equal to each other.

10. The image sensor of claim 1, wherein:
the first imaging pixel group include a second imaging pixel that is adjacent to the phase difference detection pixel in a second direction, which is opposite to the first direction, a third imaging pixel that is adjacent to the phase difference detection pixel in a third direction, which is crossing the first direction, and a fourth imaging pixel that is adjacent to the phase difference detection pixel in a fourth direction, which is opposite to the third direction, and
wherein the light-receiving area of the first imaging pixel is the smallest, a light-receiving area of the second imaging pixel is the largest, and light-receiving areas of the third imaging pixel and the fourth imaging pixel are substantially equal to each other.

11. An image sensor, comprising:
a substrate; and
a plurality of pixels formed on the substrate with each pixel having one photoelectric conversion element that converts light into an electrical signal,
wherein the pixels are structured to include imaging pixels that convert incident light into imaging pixel signals for forming an image and phase difference detection pixels each of which includes an open part which allows reception of light to convert the received light into a phase difference detection pixel signal for optical sensing of a phase of the image, is eccentric in position within each phase difference detection pixel in a first direction, and is arranged to be adjacent to different imaging pixels, and
wherein at least one imaging pixel adjacent to a phase difference detection pixel includes a light-shield pattern formed over the substrate so as to overlap a photoelectric conversion element of the imaging pixel to form an open part for receiving light in a light-receiving area smaller than a light-receiving area of another imaging pixel among the imaging pixels.

12. The image sensor of claim 11, wherein the imaging pixel adjacent to a corresponding phase difference detection pixel having a light-receiving area smaller than a light-receiving area of another imaging pixel among the imaging pixels is an imaging pixel that is shifted from the corresponding phase difference detection pixel along the first direction.

13. The image sensor of claim 11, wherein there are multiple imaging pixels that are adjacent to a corresponding phase difference detection pixel and that each have a light-receiving area smaller than a light-receiving area of some other imaging pixels among the imaging pixels.

14. The image sensor of claim 13, wherein the multiple imaging pixels that are adjacent to a corresponding phase difference detection pixel and that each have a light-receiving area smaller than a light-receiving area of some other imaging pixels among the imaging pixel are structured to sense light of a designated color.

15. The image sensor of claim 14, wherein the designated color is a blue color.

16. The image sensor of claim 13, wherein each of the other imaging pixels among the imaging pixels, which have a light-receiving area larger than a light-receiving area of the multiple imaging pixels that are adjacent to a corresponding phase difference detection pixel and are structured to sense light of the designated color, is structured to sense light of a color different from the designated color.

17. The image sensor of claim 11, further comprising:
a light blocking layer formed between a photoelectric conversion element of each phase difference detection pixel and a photoelectric conversion element of an imaging pixel adjacent to each phase difference detection pixel to reduce optical crosstalk.

18. The image sensor of claim 17, wherein the light blocking layer fills a trench formed in the substrate.

19. The image sensor of claim 17, wherein the light blocking layer at least partially covers the photoelectric conversion element of the adjacent imaging pixel.

20. The image sensor of claim 17, wherein the light blocking layer at partially covers the photoelectric conversion element of the phase difference detection pixel.

21. The image sensor of claim 11, further comprising:
a grid pattern formed over the substrate along boundaries of the phase difference detection pixel and the imaging pixels, wherein the light-shield pattern is structured to abut on the grid pattern.

22. An image sensor, comprising:
a substrate including a plurality of photoelectric conversion elements respectively corresponding to a plurality of pixels, wherein the pixels include a phase difference detection pixel having an open part which is eccentrically located in the phase difference detection pixel in a first direction, and a plurality of imaging pixels surrounding the phase difference detection pixel, and wherein the plurality of imaging pixels include a first imaging pixel that is adjacent to the phase difference detection pixel in the first direction;
a grid pattern formed over the substrate along boundaries of the pixels;
a first light-shield pattern that formed over a photoelectric conversion element of the first imaging pixel, the first light-shield pattern abutting on the grid pattern and having a first open part and having a first open part, wherein an area of the first open part is smaller than a light-receiving area of remaining imaging pixels;
a light blocking layer formed between a photoelectric conversion element of the phase difference detection pixel and the photoelectric conversion element of the first imaging pixel.

23. The image sensor of claim 22, wherein the first light-shield pattern has a ring shape to include a peripheral area that blocks light and a central open part that allows transmission of light.

24. The image sensor of claim 23, wherein the peripheral area includes a first region that is close to the phase difference detection pixel and a second region different from the first region, the first region having a line width wider than the second region.

25. The image sensor of claim 22, further comprising:
a second light-shield pattern formed over a photoelectric conversion element of a second imaging pixel that is adjacent to the phase difference detection pixel in a second direction, which is opposite to the first direction, among the imaging pixels, the second light-shield pattern abutting on the grid pattern and having a second open part;
a third light-shield pattern formed over a photoelectric conversion element of a third imaging pixel that is adjacent to the phase difference detection pixel in a third direction, which is perpendicular to the first direction, among the imaging pixels, the third light-shield pattern abutting on the grid pattern and having a third open part; and
a fourth light-shield pattern formed over a photoelectric conversion element of a fourth imaging pixel that is adjacent to the phase difference detection pixel in a fourth direction, which is opposite to the third direction, among the imaging pixels, the fourth light-shield pattern abutting on the grid pattern and having a fourth open part,
wherein each of the second to fourth open parts has an area that is smaller than a light-receiving area of remaining imaging pixels.

26. The image sensor of claim 25, wherein each of the second to fourth light-shield pattern has a ring shape to include a peripheral area that blocks light and a central open part that allows transmission of light.

27. The image sensor of claim 26, wherein the peripheral area includes a first region that is close to the phase difference detection pixel and a second region different from the first region, the first region having a line width wider than the second region.

28. The image sensor of claim 25, wherein the areas of the first to fourth open parts are substantially equal to each other.

29. The image sensor of claim 25, wherein the area of the first open part is smallest, and the areas of the second to fourth open parts are substantially equal to each other.

30. The image sensor of claim 25, wherein the area of the first open part is smallest, the area of the second open part is largest, and the areas of the third open part and the fourth open part are substantially equal to each other.

31. The image sensor of claim 25, wherein the first to fourth imaging pixels sense a same color.

32. The image sensor of claim 22, wherein the light blocking layer is formed in a trench formed in the substrate.

33. The image sensor of claim 22, wherein the light blocking layer is formed on at least one of sidewalls of the photoelectric conversion element of the first imaging pixel.

34. The image sensor of claim 33, wherein the light blocking layer is formed on at least one of sidewalls of the photoelectric conversion element of the phase difference detection pixel.

* * * * *